United States Patent
Akiha et al.

[11] Patent Number: 5,966,805
[45] Date of Patent: Oct. 19, 1999

[54] END CONNECTING PORTION OF A PLANAR CIRCUIT BODY, AND METHOD OF MAKING SAME

[75] Inventors: Yoshinobu Akiha; Hitoshi Ushijima, both of Shizuoka, Japan

[73] Assignee: Yazaki Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/742,752

[22] Filed: Nov. 1, 1996

[30] Foreign Application Priority Data

Nov. 2, 1995 [JP] Japan ................................. 7-286111

[51] Int. Cl.⁶ ........................................... H01R 9/00
[52] U.S. Cl. .......................... 29/843; 29/831; 29/840; 29/846; 29/860; 29/DIG. 12
[58] Field of Search ............................ 29/830, 831, 840, 29/841, 843, 846, DIG. 12, 860

[56] References Cited

U.S. PATENT DOCUMENTS

| | | | |
|---|---|---|---|
| 3,751,801 | 8/1973 | Praeger et al. | 29/360 |
| 4,236,038 | 11/1980 | Taylor | 29/830 |
| 4,668,581 | 5/1987 | Lue et al. | 29/843 X |
| 4,775,917 | 10/1988 | Eichhorn et al. | 29/843 X |
| 5,041,183 | 8/1991 | Nakamura et al. | 29/883 X |
| 5,045,641 | 9/1991 | Urushiata et al. | 29/860 X |
| 5,084,961 | 2/1992 | Yoshikawa | 29/840 |
| 5,316,205 | 5/1994 | Melton | 29/840 X |
| 5,357,084 | 10/1994 | McKee et al. | 29/860 X |
| 5,361,491 | 11/1994 | Oomachi et al. | 29/840 X |
| 5,379,512 | 1/1995 | Ingle et al. | 29/843 X |
| 5,489,551 | 2/1996 | Castleberry | 29/840 X |
| 5,601,678 | 2/1997 | Gerber et al. | 29/830 X |

FOREIGN PATENT DOCUMENTS

| | | | |
|---|---|---|---|
| 58-1918 | 1/1983 | Japan | H01B 7/08 |
| 320089 | 11/1992 | Japan | 29/DIG. 12 |

*Primary Examiner*—Lee W. Young
*Assistant Examiner*—Rick Kiltae Chang
*Attorney, Agent, or Firm*—Sughrue, Mion, Zinn, Mackpeak & Seas, PLLC

[57] ABSTRACT

A connecting end portion of a planar circuit body and method of making same in which an end portion is directly formed into a terminal thereby improving conductivity and simplifying the connection. According to one embodiment, a connecting end portion of a flat cable is formed by laminating a rectangular circuit conductor with an insulating cover material, a terminal member is fixedly secured to the planar circuit conductor at an end portion of the circuit conductor with a conductive adhesive agent, and plated metal layer is formed thereon.

10 Claims, 4 Drawing Sheets

END CONNECTING PORTION OF A PLANAR CIRCUIT BODY, AND METHOD OF MAKING SAME

BACKGROUND OF THE INVENTION

This invention relates to a connecting end portion of a planar circuit body, such as a flat cable or a printed circuit body, and the method of manufacturing same.

In general, a planar circuit body, such as a flat cable formed with rectangular conductors (by laminating), and a printed circuit body (formed by printing), each has a connecting end portion which is to be engaged with or connected to a socket or connector.

Examples of known connection end portions of a flat cable are described below.

In one known example, male or female terminals, which are formed by pressing, are fixedly connected to the ends of conductors by welding, thermo-compression bonding, or ultrasonic welding. However, such a connecting end portion tends to be welded or connected insufficiently.

Another example is shown in FIG. 5, in which one side of insulating covers 20 of a conductor 21 is removed so as to partially expose the conductor 21 (as indicated at 22). A reinforcing layer 23 is set under the end portion of the exposed conductor so that the end portion serves as a terminal. When the end portion is inserted into a socket 26 having an elastic terminal 27, the conductor has increased mechanical strength because of the reinforcing layer 23.

FIG. 6 shows another example in which insulating cover 20 of conductors 21 is removed at the ends to expose the conductors 21 (as indicated at 24), and a reinforcing layer 25 of insulating material is set under the exposed conductors 24 (cf. Unexamined Japanese Patent Application Sho. 58-1918 for a more detailed discussion of the terminal connecting sections shown in FIGS. 5 and 6). In the examples shown in FIGS. 5 and 6, the reinforcing layers 23 (FIG. 5) and 25 (FIG. 6) tend to be worn, damaged and/or deformed by the contact load of the mating socket and the elastic terminal 27 of the connector 26. In addition, the contact load decreases over time so that the connecting end portion is liable to provide insufficient contact.

Besides the above examples, a printed circuit body is also known in the art. In order to form a printed circuit body, conductive paste is laid on an insulating film or an insulating covering material, such as film, by screen printing, and then solidified or dried, to form circuit conductors (circuit patterns). Examples of the printed circuit body are described below.

The end portions of the circuit conductors are brought into contact with an electronic component or components. However, this suffers from the problems that the connecting end portion tends to have a high electrical resistance.

In another example, the end portions of the circuit conductors are connected to an electronic component or components by soldering. This is problematic because it is not applicable to a film substrate which has a low melting point.

In yet another example, a special connector is employed. This example is problematic because it is difficult to apply the connecting end portion to a printed circuit body for high power because heat is generated. In a printed circuit, a circuit pattern is formed by printing, and after being solidified, it is subjected to copper plating until generally the conductor thickness reaches the square of the wire diameter.

In addition to the problems mentioned above for the various examples, in each of these examples, the connecting end portion requires a welding or soldering step, which increases the number of required manufacturing steps, thereby lowering work efficiency.

SUMMARY OF THE INVENTION

In view of the foregoing, an object of the invention is to provide a connecting end portion of a planar circuit body and a method of making same in which an end portion is directly formed into a terminal, thereby improving the conductivity, simplifying the connection, and reducing the manufacturing cost.

The foregoing object of the invention has been achieved by providing a connecting end portion of a planar circuit body which is formed by covering a planar circuit conductor with an insulating cover material, and a terminal member which is fixedly secured to the planar circuit conductor at an end portion of the planar circuit body with a bonding and solidifying material.

In the connecting end portion of the planar circuit the terminal member is bonded to the end portion of the planar circuit body with the bonding and solidifying material, so that the end portion is directly formed into a terminal. Hence, the connecting end portion of the planar circuit body is free from the difficulty accompanying the prior examples discussed above which tend to be unsatisfactorily welded or thermally deformed.

According to one embodiment of the invention, the planar circuit body is a flat cable which is formed by laminating a rectangular circuit conductor with insulating cover material, an end portion of the flat cable is exposed, and the terminal member is fixedly secured to the exposed cable with a conductive adhesive agent.

Hence, according to this embodiment the terminal member is bonded to the end portion of the flat cable with the bonding and solidifying material, so that the end portion of the flat cable is directly formed into a terminal. Further, a plated metal layer may be formed on the terminal member.

With a plated metal layer formed on the terminal member, the connection strength of the circuit conductor of the flat cable and the terminal member is increased, and the terminal member and the socket have improved electrical conductivity.

According to another embodiment, the planar circuit body is a printed circuit body in which a circuit conductor is printed on an insulating cover material with a conductive paste, and the terminal member is directly fixedly secured to the conductive paste forming the circuit conductor. In this embodiment, the conductive paste serves as an adhesive agent, so that the terminal member is directly bonded to the end portion of the circuit conductor without an adhesive agent; that is, the end portion of the circuit conductor is directly formed into a terminal. In accordance with this embodiment a plated metal layer may be formed on the terminal member (except a portion thereof which is exposed outside the planar circuit body), and on the circuit conductor.

Hence, in the connecting end portion of the planar circuit body according to this embodiment, the connection strength of the circuit conductor and the terminal is increased, and the terminal member and the socket have improved electrical conductivity. The provision of the plated metal layer increases the sectional area of the circuit conductor, and accordingly the electrical capacity. Moreover, since no plated metal layer is formed on the part of the terminal member which is exposed outside the planar circuit body, the connecting end portion of the planar circuit body is suitable for the socket which may require that the terminal be strictly controlled in thickness.

The present invention also provides a method of manufacturing a connecting end portion of a planar circuit body which includes:

removing an insulating cover material from an end portion of a flat cable, to expose one side of a circuit conductor;

forming a layer of thermo-setting conductive adhesive agent on the exposed surface of the circuit conductor;

connecting a terminal member to the layer of conductive adhesive agent; and thermally solidifying the layer of conductive adhesive agent.

According to this method, no welding step is included; that is, the end portion of the flat cable is directly formed by only the bonding step.

According to another embodiment, a method of manufacturing a connecting end portion of a planar circuit body includes:

applying a conductive paste on an insulating cover material by screen printing to form a circuit conductor;

connecting a terminal member to an end portion of the circuit conductor before the conductive paste is solidified;

solidifying the conductive paste; and laminating a cover film.

In this method, no adhesive agent is employed; instead, the solidification of the conductive paste is utilized to directly form the end portion of the printed circuit body into a terminal.

BRIEF DESCRIPTION OF THE DRAWING(S)

FIG. 1 shows a connecting end portion of a planar circuit body, which constitutes a first embodiment of the invention.

FIGS. 2(a)–2(c) show the steps of manufacturing the connecting end portion of the planar circuit body according to the first embodiment in more detail. More specifically, FIG. 2(a) is a side view showing the application of a conductive adhesive agent; FIG. 2(b) is a side view showing the connection of a terminal member; and FIG. 2(c) is a vertical sectional view showing the end portion of the planar circuit body which is engaged with a socket after being plated.

FIGS. 3(a)–3(c) are perspective views for describing the steps of manufacturing a connecting end portion of a planar circuit body, according to a second embodiment of the invention. More specifically, FIG. 3(a) shows a screen printing operation, FIG. 3(b) shows the connection of a terminal, and FIG. 3(c) shows a plating step.

DETAILED DESCRIPTION OF THE PREFERRED EMBODIMENTS

Figure 1:
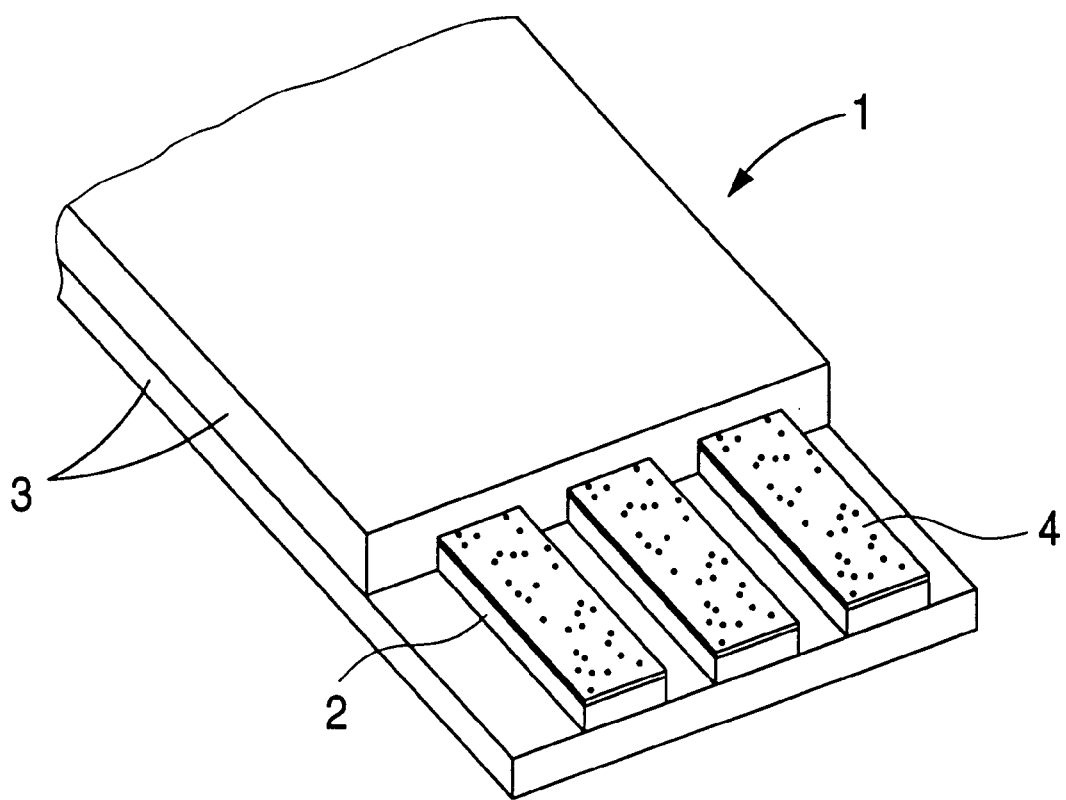
Figure 2:
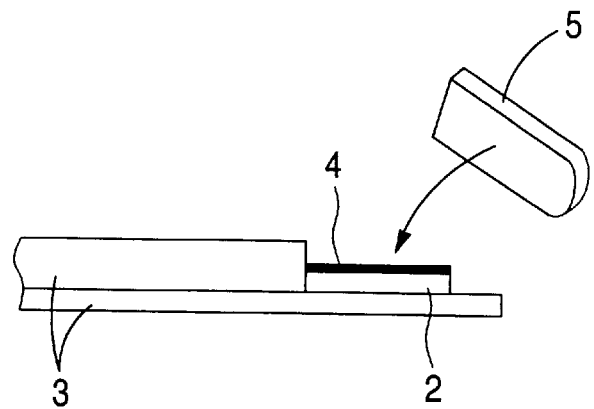
Figure 2:
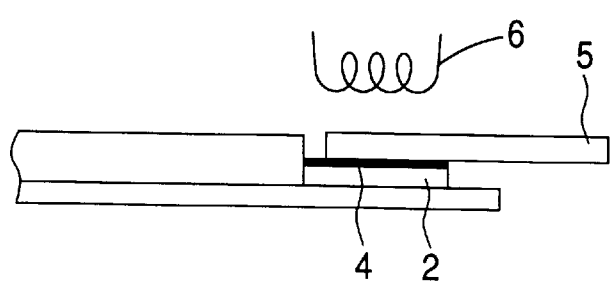
Figure 2:
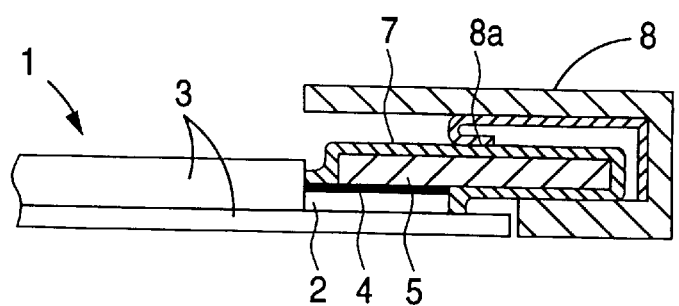

FIGS. 1 and 2 show a first embodiment of the invention in which a planar circuit body is a flat cable. The planer circuit body, or flat cable 1, includes: a plurality of rectangular metal wires, namely, circuit conductors 2; and an insulating cover member 3. The cover member 3 is formed by laminating insulating films on the circuit conductors 2.

Terminal members are formed at the end portion of the flat cable 1 as follows:

First, as shown in FIG. 1 and FIG. 2(a), at the end portion of the flat cable 1, the upper portion of insulating cover member 3 is removed to expose the circuit conductors 2. Under this condition, a thermo-setting conductive adhesive agent layer 4 is formed on the exposed surfaces of the circuit conductors 2 by coating or spraying a thermo-setting conductive adhesive agent.

As shown in FIG. 2(b), a rectangular terminal member 5 (formed by, for example, punching a metal plate) is connected to the upper surface of the conductive adhesive agent layer 4. In the embodiment shown, the terminal member 5 is a male terminal; however, the invention is not limited to such a configuration. That is, the terminal member may be formed into various configurations, including, for example, a cylindrical female configuration. The connecting part of the terminal member 5 and the conductive adhesive agent layer 4 are heated and dried with a heating unit 6 (e.g., an infrared ray lamp), in order to solidify the conductive adhesive agent layer 4.

Next, as shown in FIG. 2(c), when necessary, the terminal member 5 is subjected to plating, so that a plated metal layer 7 is formed on the entire surface of the terminal member 5. Thus, the terminal member 5 which is integral with the circuit conductor 2 is formed. The terminal members 5 thus formed are inserted into a socket or connector 8.

In the above-described embodiment, the plated metal layer 7 increases the strength of contact between the circuit conductor 2 and the terminal member 5; however, it is not always necessary for the plated metal layer 7 to cover the entire surface of the terminal member 5. That is, in the case where the connector 8 requires strict control on the thickness of the terminal, it is preferable for part of the terminal member 5 not to be plated. Specifically, it is preferable for that part of the terminal member 5 which is brought into contact with the contact terminal 8a of the connector 8 not to be plated.

In the above-described embodiment, the terminal members are fixedly secured through the conductive adhesive agent layers 4 to the end portions of the circuit conductors 2, respectively. In other words, the end portions of the flat cable are directly formed into a terminal section. Furthermore, since no joining method, such as welding, is employed, the connecting end portion of the planar circuit body is free from the difficulty that the components are insufficiently coupled to one another. Moreover, since only the terminal members 5 are engaged with the socket or connector, the connecting end portion is never deformed, thus improving its durability. In addition, the provision of the terminal members 5 increases the sectional areas of the connecting regions, which improves the electrical conductivity of the planer circuit body.

Figure 3:
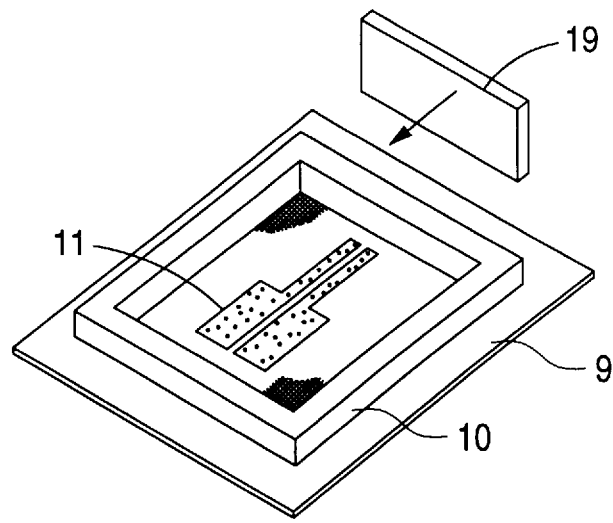
Figure 3:
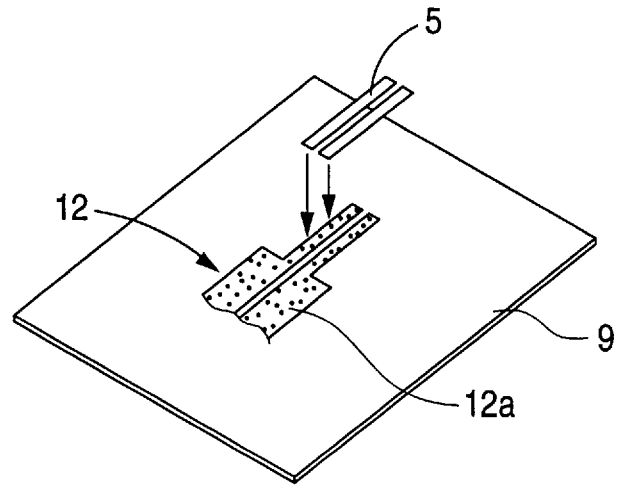
Figure 3:
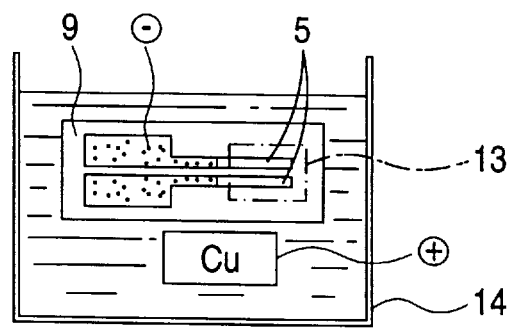

FIG. 3 shows another embodiment of the invention, in which the planar circuit body is a printed circuit body.

FIG. 3(a) shows a method of forming a circuit conductor according to the known screen printing method. Specifically, a form plate 10 of "Tetron" 200 mesh is set on an insulating cover member 9 which is made of a polyester film or insulating substrate, and a conductive paste 11 prepared by using a phenol-based resin or an epoxy-based resin containing copper powder is transferred onto the insulating cover member 9 with a squeegee 19. As a result, as shown in FIG. 3(b), circuit conductors 12 of the conductive paste are printed on the insulating cover member 9 (only the end portions 12a of the circuit conductors 12 is shown).

Figure 4:
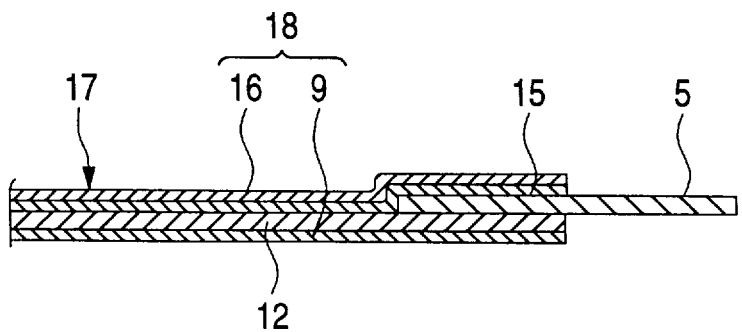
FIG. 4 is a sectional view of the connecting end portion of the planar circuit body according to the second embodiment.
Figure 5:
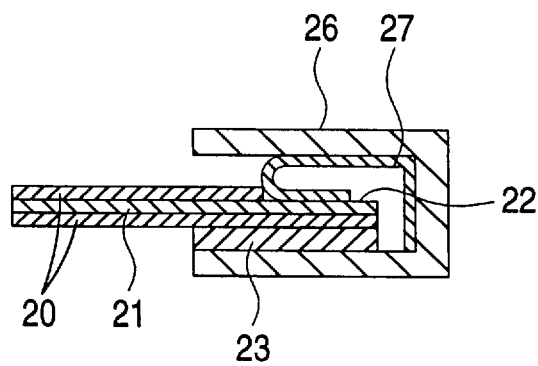
FIG. 5 is a vertical sectional side view showing a known connecting end portion of a planar circuit body.
Figure 6:
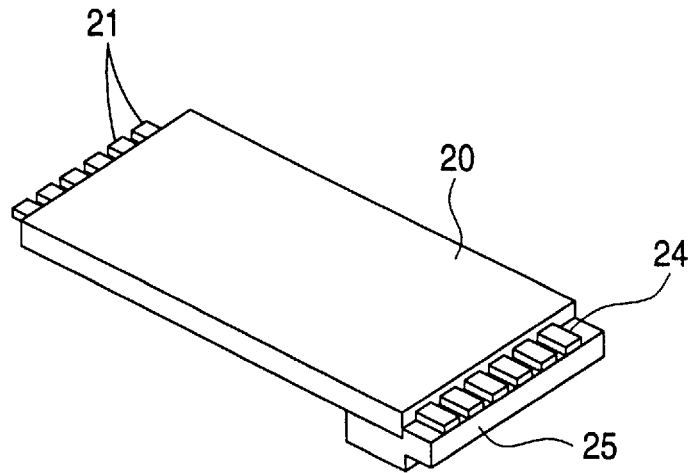
FIG. 6 is a perspective view showing a known connecting end portion of the planar circuit body.

Next, as shown in FIG. 3(c), with the terminal members 5 partially masked as indicated at 13, the insulating cover member 9 is placed, in its entirety, in a plating tank 14, so that the circuit conductors 12 including the end portions 12a, and those parts of terminals members 5 which have not been masked are plated with copper (Cu). In the case where the terminal members 5 are, for example, female terminals, members 5 are masked with rubber-bag-shaped masking materials or with clay. In the final step, an anti-corrosion treatment is carried out, and a cover film 16 is formed by lamination. FIG. 4 shows the completed planar circuit body, namely, printed circuit body 17.

Referring to FIG. 4, the rear end portions of the terminal members 5 are fixedly secured onto the circuit conductors 12 which are covered with an insulating cover 18 comprising insulating film member 9 and cover film 16. The circuit conductors 12, and the surfaces of the parts of the terminal members 5 which are secured to the circuit conductors 12 are plated with copper as indicated at 15. The plated copper layer 15 is covered with the cover film 16. The exposed portions of the terminal members 5 are masked as indicated at 13 (FIG. 3), and therefore are not plated. The reason for this is to eliminate the difficulty that, because of the thickness of plating, it becomes difficult to insert the terminal members 5 into the socket or connector 8. Hence, the connecting end portion thus formed is suitably applied to the connector 8 with which requires that the terminal be strictly controlled in thickness.

As in the first embodiment, in the second embodiment the plated metal layer increases the strength of connection of the terminal members 5 and the circuit conductor 12. Further, the plated metal layer increases the thickness of the circuit conductors, and accordingly the capacity of current; however, as in the first embodiment, it is not always necessary to form the plated metal layer.

In the second embodiment, the terminal member 5 is fixedly secured to the end portion of each of the circuit conductors 12 by conductive paste. That is, the terminal member is directly fixedly bonded to the conductive paste which forms the circuit conductor of the printed circuit body. Therefore, the terminal member 5 can be secured directly to the circuit conductor 12 without the use of an adhesive agent. This feature makes it possible to form the end portion of the printed circuit body 17 into a terminal or terminals. In this case, no connecting method such as welding is employed, and therefore the resultant connecting end portion of the planar circuit body does not suffer from the problem of an insufficient connection which is one of the disadvantages attendant with the conventional connecting end portion. Furthermore, with the connecting end portion of the planar circuit body of the invention, only the terminal members 5 are engaged with the socket or connector, and therefore the connecting end portion does not tend to deform, thereby providing improved durability. In addition, the provision of the terminal members 5 increases the sectional areas of the connecting regions, which improves the electrical conductivity of the planer circuit body.

What is claimed is:

1. A method of manufacturing an end connecting portion of a planar circuit which contains a circuit conductor, comprising:

exposing a circuit conductor at an end portion of the planar circuit by removing a portion of an insulatiing cover member of the circuit conductor from one end of the circuit conductor;

forming a layer of thermo-setting conductive adhesive agent on a surface of the exposed circuit conductor;

connecting a terminal member to said layer of conductive adhesive agent;

thermally solidifying said layer of conductive adhesive agent thereby fixedly securing said connected terminal member; and masking a portion of said terminal member and placing said terminal member in a plating tank for plating unmasked portions of said terminal member with copper.

2. The method as defined in claim 1, further comprising forming a layer of plated metal on at least said portion of said terminal member.

3. The method as defined in claim 2, wherein the layer of plated metal is formed on an entire surface of said terminal member.

4. The method as defined in claim 2, wherein said portion of said terminal member which is masked, extends beyond the planar circuit, and wherein the layer of plated metal is not formed on said portion of said terminal member which extends beyond the planar circuit.

5. The method as defined in claim 4, further comprising engaging the terminal member with a socket.

6. The method as defined in claim 1, wherein the insulating cover member is formed by lamination.

7. A method of manufacturing a planar circuit which contains a circuit conductor, comprising:

applying a conductive paste on an insulating film member by screen printing;

connecting a terminal member to an end portion of said conductive paste, prior to solidification of said conductive paste;

solidifying said conductive paste forming a circuit conductor, thereby fixedly securing said terminal member to an end portion of said circuit conductor; and masking a portion of said terminal member and placing said terminal member in a plating tank for plating unmasked portions of said terminal member with copper.

8. The method as defined in claim 7, further comprising providing an insulating film on said circuit conductor and on said terminal member except for said portion of said terminal member, wherein said insulating film includes a cover film and said insulating film member.

9. A method of manufacturing a planar circuit according to claim 7, further comprising setting a form plate on said insulating film member and applying the conductive paste with a squeegee onto said insulating film member.

10. A method of manufacturing a planar circuit according to claim 7, further comprising treating said insulating film member with an anti-corrosion material and laminating a cover film over said insulating film member.

* * * * *